US009368963B2

(12) United States Patent
Reimann et al.

(10) Patent No.: US 9,368,963 B2
(45) Date of Patent: Jun. 14, 2016

(54) ESD PROTECTION

(71) Applicant: NXP B.V., Eindhoven (NL)

(72) Inventors: Klaus Reimann, Eindhoven (NL); Hans-Martin Ritter, Nahe (DE); Wolfgang Schnitt, Seester (DE); Anco Heringa, Waalre (NL)

(73) Assignee: NXP B.V., Eindhoven (NL)

( * ) Notice: Subject to any disclaimer, the term of this patent is extended or adjusted under 35 U.S.C. 154(b) by 136 days.

(21) Appl. No.: 14/072,122

(22) Filed: Nov. 5, 2013

(65) Prior Publication Data
US 2014/0160607 A1 Jun. 12, 2014

(30) Foreign Application Priority Data

Dec. 6, 2012 (EP) .................................. 12195904

(51) Int. Cl.
*H02H 9/04* (2006.01)
*H01L 27/02* (2006.01)

(52) U.S. Cl.
CPC ........... *H02H 9/046* (2013.01); *H01L 27/0255* (2013.01)

(58) Field of Classification Search
USPC .......................................................... 361/56
See application file for complete search history.

(56) References Cited

U.S. PATENT DOCUMENTS

| 7,839,612 | B1* | 11/2010 | Chan ................................ 361/56 |
| 8,081,412 | B2* | 12/2011 | Fitzpatrick et al. ............ 361/118 |
| 8,982,587 | B2* | 3/2015 | Nguyen .................. H02M 1/14 363/39 |
| 2003/0013258 | A1* | 1/2003 | Lee ......................... G03F 1/144 438/298 |
| 2004/0080877 | A1* | 4/2004 | Jenkins ............... H01L 27/0255 361/19 |
| 2005/0146392 | A1* | 7/2005 | Karlsson et al. .............. 333/103 |
| 2006/0109595 | A1* | 5/2006 | Watanabe ........... H01L 27/0262 361/56 |
| 2006/0132996 | A1* | 6/2006 | Poulton ............... H01L 27/0255 361/56 |
| 2008/0091254 | A1* | 4/2008 | Wong .................... A61H 39/002 607/115 |
| 2008/0253045 | A1* | 10/2008 | Sato ..................... H01L 27/0251 361/56 |
| 2009/0195946 | A1* | 8/2009 | Kleveland ....................... 361/56 |
| 2010/0103580 | A1* | 4/2010 | Fitzpatrick et al. ........... 361/118 |

(Continued)

FOREIGN PATENT DOCUMENTS

| WO | 01/31708 A1 | 5/2001 |
| WO | 2008/091254 A1 | 7/2008 |

OTHER PUBLICATIONS

Meyer, R. G. et al. "Distortion in Variable-Capacitance Diodes", IEEE J. of Solid-State Circuits, vol. 10, No. 1, pp. 47-54 (Feb. 1975).
Park, J. M. "3.3.2 SJ$^{pn}$—Diode", 9 pgs., retrieved from the Internet Mar. 5, 2012. at: http://www.iue.tuwien.ac.at/phd/park/node42.html (Oct. 28, 2004).

(Continued)

*Primary Examiner* — Thienvu Tran
*Assistant Examiner* — Angela Brooks

(57) ABSTRACT

An ESD protection circuit comprises a series connection of at least two protection components between a signal line to be protected and a return line (e.g. ground), comprising a first protection component connected to the signal line and a second protection component connected to the ground line. They are connected with opposite polarity so that when one conducts in forward direction the other conducts in reverse breakdown mode. A bias voltage source connects to the junction between the two protection components through a bias impedance. The use of the bias voltage enables the signal distortions resulting from the ESD protection circuit to be reduced.

11 Claims, 9 Drawing Sheets

(56) References Cited

U.S. PATENT DOCUMENTS

| | | | |
|---|---|---|---|
| 2011/0092246 A1* | 4/2011 | Ginsburg | H01L 27/0255 |
| | | | 455/550.1 |
| 2011/0163352 A1* | 7/2011 | Gee | H01L 23/60 |
| | | | 257/173 |
| 2011/0181990 A1* | 7/2011 | Huang | H02H 9/046 |
| | | | 361/56 |
| 2011/0211285 A1* | 9/2011 | Huang | H02H 9/046 |
| | | | 361/56 |
| 2014/0268447 A1* | 9/2014 | Gudem et al. | 361/56 |

OTHER PUBLICATIONS van Bezooijen, A. et al. "RF-MEMS Based Adaptive Antenna Matching Module", IEEE Radio Frequency Integrated Circuits Symposium, pp. 573-576 (2007).

Huang, C. et al. "Enabling Low-Distortion Varactors for Adaptive Transmitters", IEEE Trans. on Microwave Theory and Techniques, vol. 56, No. 5, pp. 1149-1163 (May 2008).

Extended European Search Report for EP Patent Appln. No. 12195904.3 (Apr. 14, 2013).

* cited by examiner

ESD PROTECTION

CROSS-REFERENCE TO RELATED APPLICATIONS

This application claims the priority under 35 U.S.C. §119 of European patent application no. 12195904.3, filed on Dec. 6, 2012, the contents of which are incorporated by reference herein.

This invention relates to ESD protection circuits. ESD protection is used to protect circuit components from voltage spikes, for example caused by static electricity.

Generally, an ESD protection circuit provides a current path to ground when a voltage exceeding a limit is present.

One common way to provide ESD protection, for example at antennas, is to use passive filters. An inductor or a capacitance can be coupled to ground, or dedicated components like spark-gaps or varistors can be used. However, these components can limit the bandwidth and lower the design freedom for the system designer. The dedicated components can also have overshoot voltages of hundreds of volts that again necessitate extra protection filters.

Semiconductor protection components offer very reliable ESD protection with low overshoot, but cause signal distortion. ESD protection devices based on semiconductor junctions or gates have a voltage-dependent capacitance, especially around 0V. This can cause a high distortion, for example at an antenna where a fast, low voltage-overshoot device is desired. In particular, the inherent voltage dependence of the diode capacitance causes unwanted inter-modulation of the antenna signal.

According to the invention, there is provided an ESD protection circuit comprising a series connection of at least two unidirectional semiconductor components between a signal line to be protected and a return line, comprising a first protection component connected to the signal line and a second protection component connected to the return line in series with the first protection component, and a bias voltage source which connects to the junction between the two protection components through a bias impedance.

The first and second protection components preferably are arranged in series with opposite polarity.

This circuit enables the distortion caused by the ESD protection circuit to be lowered by applying a bias voltage to the junction between two opposite polarity series-connected protection components. The bias reduces the dependency of the capacitance of the first protection component on the voltage on the signal line. The impedance is used to form a filter to prevent the bias voltage source influencing the circuit performance.

The first protection component can be connected in a forward conduction direction between the signal line and the return line, and the second protection component can be connected in a reverse conduction direction between the signal line and the return line. This means a forward direction component is used to discharge ESD current from the signal line. As a result, a small component with low capacitance can be used. Thus, the capacitance of the first protection component can be less than the capacitance of the second protection component. The protection components can both be diodes, or else they can be diode-connected transistors for example.

By way of example, the bias voltage can be above 10V when the protection is to be placed directly at a GSM antenna, and can be generated within the same package or even the same die.

In a first example, the circuit comprises:

a first series connection of at least two protection components between the signal line and the return line, comprising a first protection component (for protection) and a second protection component (for clamping), and a first bias voltage source which connects to the junction between the first and second protection components through a first bias impedance; and a second series connection of at least two protection components between the signal line and the return line, comprising a third protection component and a fourth protection component, and a second bias voltage source which connects to the junction between the third and fourth protection components through a second bias impedance.

This arrangement has two branches, one for positive ESD events and one for negative ESD events. In each branch, the first protection component conducts the ESD current and this provides a low capacitance conductive path. The second (clamping) protection component is in the opposite direction.

The first bias voltage source can connect to the junction through a first bias resistor and/or a first noise blocking diode in series or another configuration with high impedance, and the second bias voltage source can connect to the junction through a second bias resistor and/or a second noise blocking diode in series or another configuration with high impedance.

Noise is prevented from reaching the signal line by the noise blocking diodes. Their high impedance forms a low-pass filter together with the capacitance of the second and fourth (clamping) protection components.

The first bias voltage source is positive and the second bias voltage source is negative with respect to the signal return line, and the first voltage source can be on the anode side and the second voltage sources can be on the cathode side of the respective noise blocking diode.

The first and second protection components can be back to back diodes connected at their cathodes the third and fourth protection components can be back to back diodes connected at their anodes. In this way, they are designed for different polarity ESD events.

The second and fourth protection components can be clamping Zener diodes with a breakdown voltage greater than the peak signal amplitude (e.g. 20V). The first and third protection components can be low capacitance diodes with a breakdown voltage above twice the clamping Zener diode breakdown voltage (e.g. 40V). The first and third protection components only conduct in the forward direction rather than in a breakdown configuration and can therefore be dimensioned to be small as the power dissipation is lower than for reverse conduction.

In a second example, the first and second protection components are each reverse clamping diodes, e.g., Zener diodes, in series with the opposite polarity. In case of an ESD pulse, one of the diodes will conduct in forward direction and one will conduct in reverse breakdown condition.

The bias voltage is applied to lower distortions. The bias voltage can be either positive or negative. It should be high enough, such that the AC signal does not drive the voltage across the one or other of the diodes too close to 0V where the C(V) dependence is steep.

In a third example, the circuit comprises:

a first series connection of at least two protection components between the signal line and an internal node, comprising a first protection component (for protection) and a second protection component (for clamping) in anti-series;

a second series connection of at least two protection components between the internal node and the return line, comprising a third protection component (for protection) and a fourth protection component (for clamping) in anti-series, a fifth protection component in a forward direction between the signal line and the internal node;

a sixth protection component in a forward direction between the return line and the internal node; and a bias voltage source which connects to the internal node through a bias impedance.

In a fourth example, the circuit comprises:

a first series connection of at least two protection components between the signal line and a first internal node, comprising a first protection component (for protection) and a second protection component (for clamping) in anti-series;

a second series connection of at least two protection components between the first internal node and the return line, comprising a third protection component (for protection) and a fourth protection component (for clamping) in anti-series, a third series connection of at least two protection components between the signal line and a second internal node, comprising a fifth protection component (for protection) and a sixth protection component (for clamping) in anti-series;

a fourth series connection of at least two protection components between the second internal node and the return line, comprising a seventh protection component (for protection) and an eighth protection component (for clamping) in anti-series, a first, positive bias voltage source which connects to the first internal node through a bias impedance; and a second, negative bias voltage source which connects to the second internal node through a bias impedance.

The circuit, i.e. the protection components, the bias voltage source(s) and the components for coupling the bias voltage(s) to the junction(s), can be formed as a single package. This single package can be provided with a minimum number of extra pins, and contains the biased ESD protection component and the required voltage generator. The component values and voltages can be tailored such that the distortion is minimal.

The circuit can have a power sensor for measuring a power level on the signal line. This can be an RF sensor for example for use in antenna matching circuits, thus providing a small-footprint solution with integrated system-level ESD protection. The power sensor signal can be provided onto a communication link for testing, configurability, transfer of status signals or sensor signals.

The invention also provides an RF antenna circuit such as a GSM antenna circuit comprising an antenna and an ESD protection circuit of the invention, wherein the signal line comprises the antenna feed.

An example of the invention will now be described in detail with reference to the accompanying drawings, in which.

The invention provides an ESD protection circuit comprising a series connection of at least two protection components between a signal line to be protected and a return line (e.g. ground), comprising a first protection component connected to the signal line and a second protection component connected to the ground line. They are connected with opposite polarity so that when one conducts in forward direction the other conducts in reverse breakdown mode. A bias voltage source connects to the junction between the two protection components through a bias impedance. The use of the bias voltage enables the signal distortions resulting from the ESD protection circuit to be reduced.

Semiconductor components typically have a non-constant capacitance that leads to signal distortions.

Figure 1:
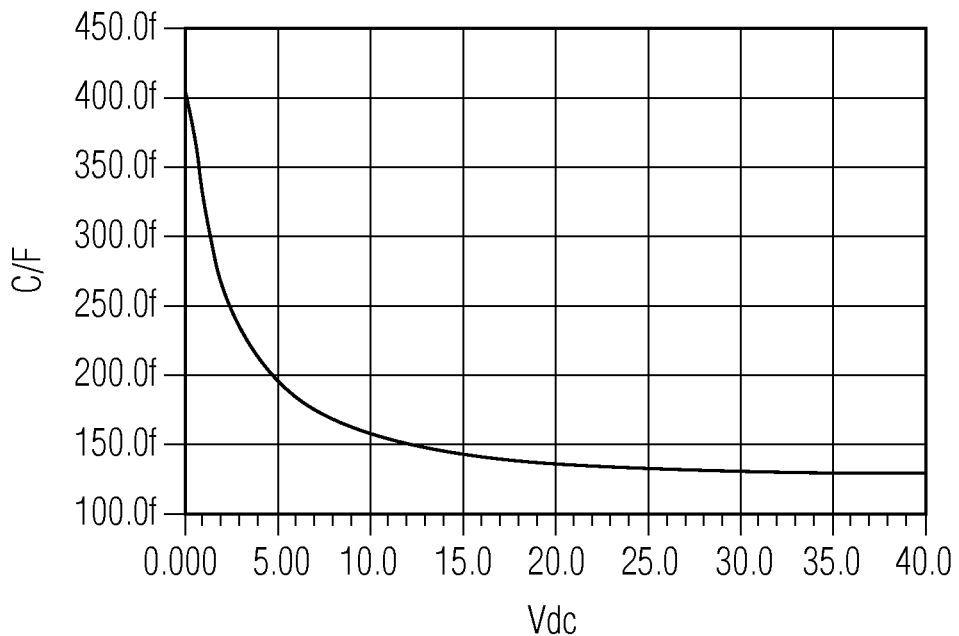
FIG. 1 shows a typical capacitance versus voltage function for a diode.

FIG. 1 shows a typical capacitance versus voltage function for a diode. For example, a pure sine voltage input signal will result in higher harmonics present in the current through the capacitor, and these harmonics can disturb the RF signal.

As shown, the diode capacitance is a function of the voltage across the pn-junction. The width of the depletion zone defines the capacitance and changes with the voltage across the junction. The relative change in capacitance (per voltage change) is smaller for higher bias voltages. It is high at 0 Volt due to an infinity point at −0.7 Volts and it is small for high voltages. Considering a very simple diode model with very high p-doping and constant low n-doping, the capacitance dependence is then:

$$C \sim \sqrt{(N/(U+\phi))}$$

Where N is the n-doping level, U is the voltage across the junction and $\phi$ is the internal voltage.

Accordingly the capacitance change per voltage change is $$dC/dU \sim -\sqrt{(N/(U+\phi)^3)}$$

Clearly this value is smaller for high voltages U.

Similar calculations can be made for more complex doping profiles but the principle is always the same: the voltage dependence of the capacitance is smaller at at higher bias levels.

The signal on an antenna may be sinusoidal, symmetrical to the ground level and with voltage levels up to several volts e.g. up to 16 Volt. Applying such a voltage signal to a structure such as diode with a voltage dependence of the capacitance will cause non-sinusoidal reaction (current) in the structure—thus giving cause to intermodulation and signal distortion.

Thus, in general there are various ways to reduce the distortions arising from the voltage-capacitance dependency:

(i) Reduce the capacitance.

This is only possible to a limited extent, because the ESD protection component should withstand ESD pulses with many amperes of current. The capacitance typically is higher for a higher ESD current or for a higher required clamping voltage of the component.

(ii) Improve the C(V) curve by tailoring the doping profile.

(iii) Use circuit configurations with lower distortion, e.g., series connections.

(iv) Bias the components such that the dependence of capacitance on the input voltage is weaker.

The invention makes use of various combinations of these measures in novel ways.

Figure 2:
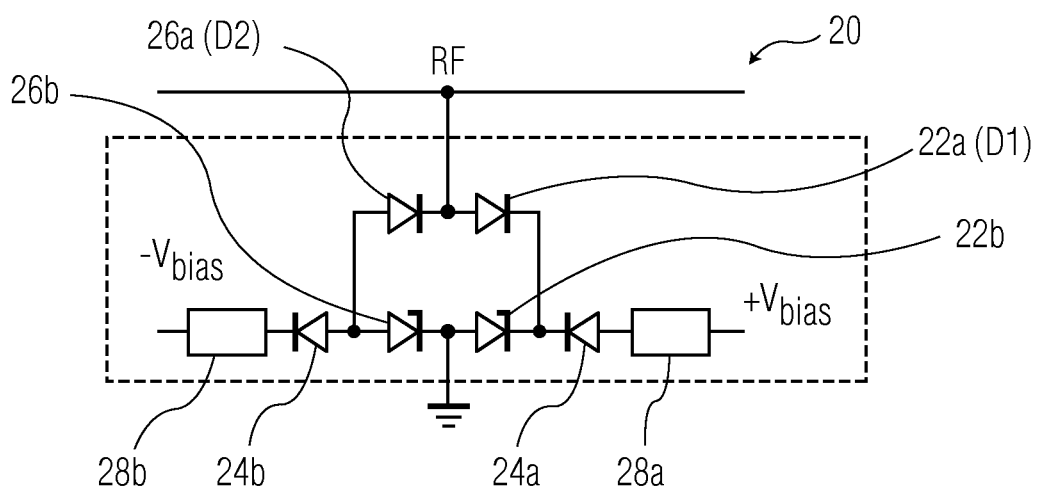
FIG. 2 shows a first example of ESD protection circuit of the invention.

FIG. 2 shows a first example of ESD protection circuit of the invention.

This example, as well as the other examples below, show the use of diodes as protection components, but other unidirectional semiconductor components with a reverse breakdown conduction mode can be used, such as diode-connected transistors.

The input signal is carried on an RF line 20. Between this RF line 20 and ground, there are two branches. A first branch has a first small forward biased diode 22a (this will be referred to as D1 below) in series with a clamping diode 22b, for example with a breakdown voltage of around 40V. The two series diodes are back to back, connected at their cathodes. A bias is applied to the junction between them, by means of a diode 24a which functions as a filter resistor to block bias noise, and a bias resistor 28a. The anode of the diode is on the bias voltage side. Only one of the two components 24a or 28a is needed to realise a high impedance. Dependent on availability, a designer can choose to use 24a or 28a or both in the ESD protection circuit or another configuration with high impedance.

An RC low-pass filter is formed together with the junction capacitance of diode 22b. Noise from the bias supply is strongly attenuated and will not enter the signal line. Extra capacitances, resistances and filters can be added if needed.

The filter cut-off frequency ideally filters out most of the bias noise at low frequencies (for example the cut-off is typically below 1 kHz) and at the signal frequency. To filter the very low frequencies in particular, a high impedance is needed. This is often not available in standard integrated circuits and best implemented by a semiconductor component such as 24a.

The bias applied is typically above 10V, and it ensures that the signal distortion is low. If the protection diode 22a (and 26a) had not been biased, then their capacitance would change strongly because the C(V) curve is steepest at low voltages (see FIG. 1). A change in capacitance modulates the AC current and causes distortions. An AC signal also self-biases the diodes. During the charging of the clamping diode 22b (and 26b), the signal is distorted. AM modulated signals will be distorted less by using the biased arrangement of the circuits of the invention.

This set of components provides a discharge path for positive voltage ESD events.

The same set of components is duplicated for the negative voltage ESD events. Thus, there is a reverse biased protection diode 26a (which is referred to as D2 below) in series with a clamping diode 26b, and they are again back to back, but connected at their anodes. A negative voltage bias applied to the junction between them (through resistor 28b and diode 24b, with the cathode of the diode on the bias voltage side) again ensures that the clamping diode is reverse biased.

This concept uses diodes in an anti-parallel connection to the RF line that conduct in forward polarity during an ESD event.

The advantage of this arrangement is that the power dissipated during an ESD pulse by the diodes that connect directly to the RF line is small because of the low voltage drop in forward direction. Their capacitance can therefore be low.

The energy is instead dissipated in the larger clamping diodes 22b,26b that also act as filter for the bias noise. This is achieved by the use of the bias voltage applied between the opposite polarity diodes.

The circuit operation will be described in more detail. For simplification of this explanation, it is assumed that the bias voltages have the same value but different polarity. Further it is assumed that the bias voltage level is larger than the signal level on the RF line (so that "+Vbias" is larger than "+RFsignal level" and "−Vbias" is lower than "−RFsignal level"). The connection between the bias voltage sources and the diodes has to have a high impedance. This can be realized in many different ways according to the state of the art.

Figure 3:
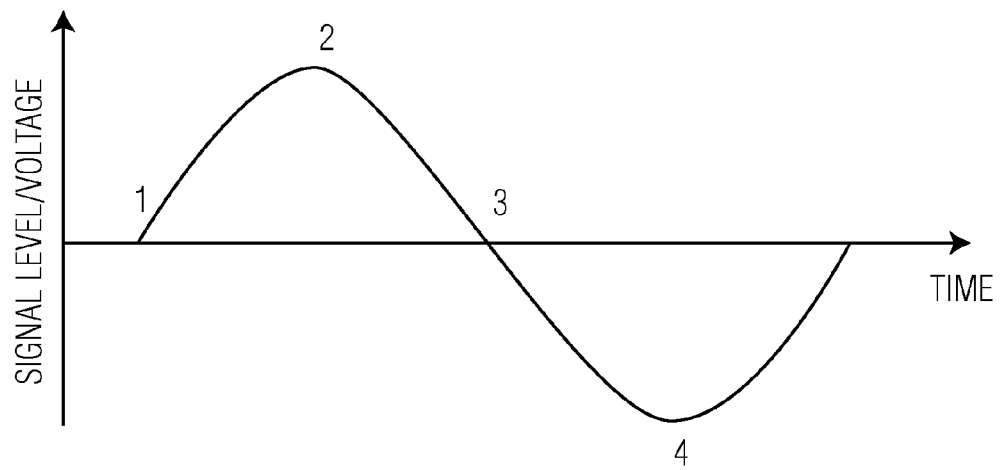
FIG. 3 shows an RF voltage waveform, for explaining the operation of the circuit of the invention.
Figure 4:
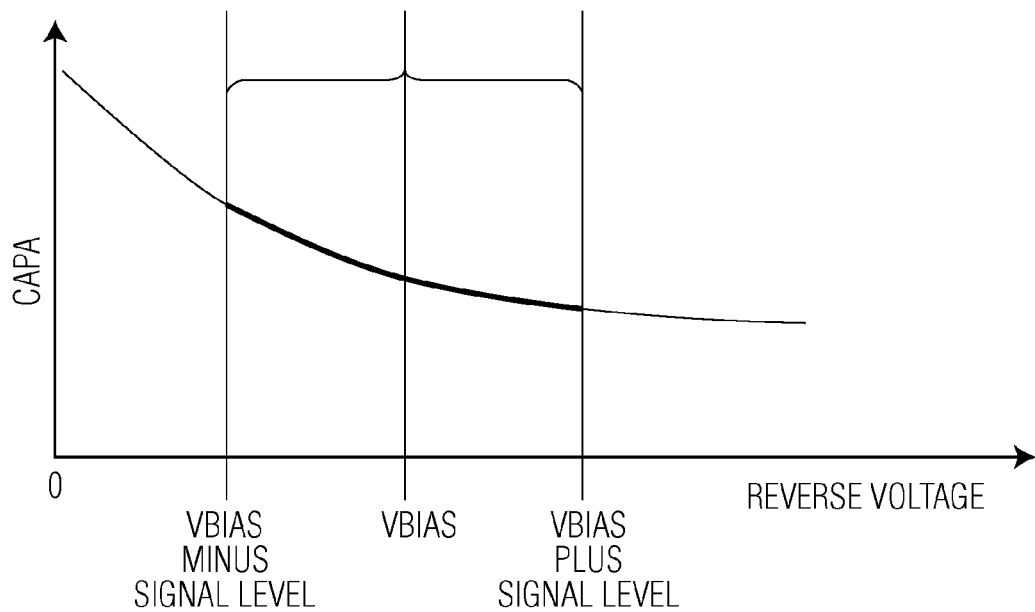
FIG. 4 shows the capacitance dependency on voltage for one of the diodes in the circuit of FIG. 2.

FIG. 3 shows the signal voltage level assumed for this analysis, with four timing instants labeled as 1 to 4. The situation at these instants is:

time 1: the voltage across D1 is "+Vbias" and across D2 is "−Vbias" (both diodes are reverse biased)

time 2: the voltage across D1 is "+Vbias" minus the signal level; the voltage across D2 is "−Vbias" plus the signal level (both diodes still reverse biased if Vbias is larger than the signal level)

time 3: similar to time 1: across D1 "+Vbias" and across D2 is "−Vbias"

time 4: the voltage across D2 is "−Vbias" minus the signal level; the voltage across D1 is "+Vbias" plus the signal level As a result of the biasing the diodes D1 and D2 see voltages between Vbias plus the signal level and Vbias minus the signal level. Their behavior in this voltage range is important for inter modulation and signal distortion. The capacitance function for this voltage range is shown in FIG. 4.

The capacitance seen at the RF line is the sum of the two diode capacitances.

Because two bias voltages are used on two (anti)-parallel diodes, the effective parasitic capacitance is the sum of the capacitances of diode D1 and diode D2. This has large implications on the capacitance-versus-voltage characteristics desired for minimizing intermodulation and distortion. This has also implications on the preferred doping profiles of the diodes.

It is noted that the concept of using biased diodes is known in the field of tuners, for selecting a desired diode capacitance for use in a tuner circuit. Biased diodes are in this case used for tuning the frequency of a resonant circuit. By varying the bias applied to the diodes the capacitance of the diodes is changed and the frequency of the circuit can thus be tuned.

The bias voltage is used as a control parameter. However, in this application, inter-modulation and signal distortion effects due to the non-linear behavior of the p-n-diodes remains a severe problem. Various concepts have been proposed for reducing this problem. Usually these concepts include the combination of several diodes and an optimization of the capacitance-voltage-characteristics of these diodes (usually by choosing adequate doping profiles).

The anti-serial connection of two identical diodes with a bias voltage applied at the center tab between the two diodes is one known circuit used in tuning applications.

This configuration cancels out all higher order terms when the capacitance is proportional to the inverse square root of the voltage (thus when $C^{-2}$ is linearly dependent on the voltage). This can be achieved with a uniform doping profile.

The invention can make use of some of the concepts applied in tuning circuits to address the problems that occur when diodes are used for ESD protection of an antenna line against over-current or over-voltage stresses.

The diodes in this case are not used for tuning a resonant circuit. Instead, they do not influence the antenna characteristics. The ideal protection diode would have no voltage dependence at all, but that is evidently not feasible for pn-junctions. Further the diode capacitance has to be as small as possible. The ideal would be zero capacitance but again this is not feasible. The diodes should easily drain any stress currents to ground whilst keeping the clamping voltage low. This translates to high current robustness, high off-impedance and low on-resistance. In the anti-serial circuit mentioned above, the effective parasitic capacitance is the inverse of the sum of the inverse of the single capacitances.

By using two bias voltages on two (anti)-parallel diodes the RF-signal can be centered on the Ground level (0 Volt). This is a big advantage in antenna applications because no extra-biasing for the RF-line is necessary. The bias on the diodes D1 and D2 also means that, if the bias voltage is larger than the signal level, they will never be used at or near 0 Volt where their capacitance is both high and strongly dependent on voltage.

Figure 5:
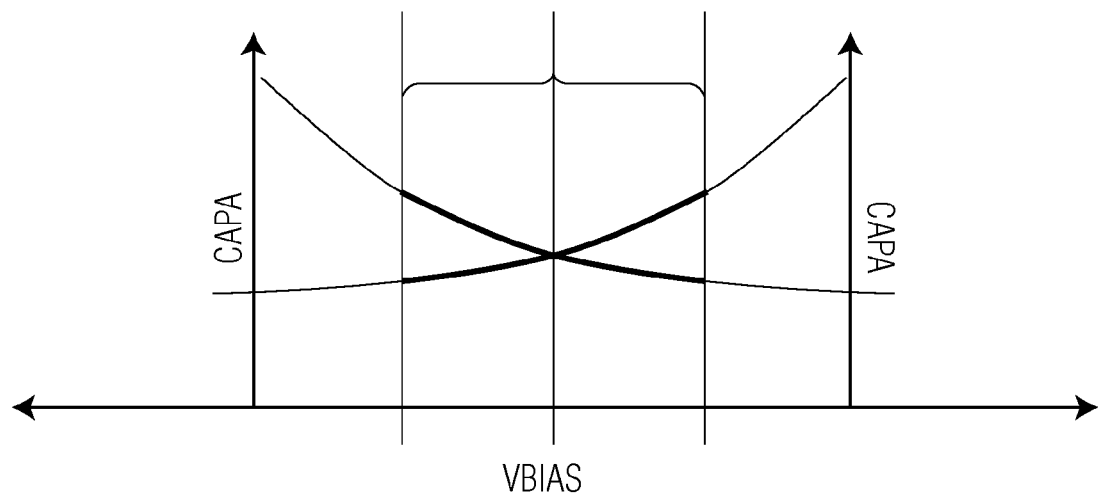
FIG. 5 shows the capacitance dependency on voltage for a pair of the diodes in the circuit of FIG. 2.

FIG. 5 shows the capacitance of the diodes D1, D2 as a function of voltage.

The dependence of the capacitance sum on the RF voltage is rather small because the capacitance of D1 decreases when the capacitance of D2 increases and vice versa. This is shown in FIG. 6.

Figure 6:
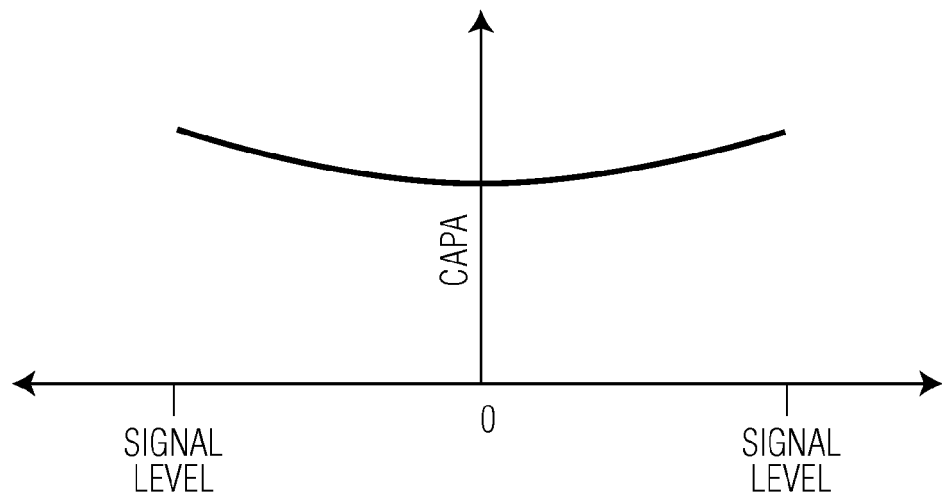
FIG. 6 shows the combined capacitance dependency on voltage derived from FIG. 5.

For the circuit of FIG. 2 and the corresponding capacitance function of FIG. 6, the first order is automatically cancelled out due to adding up of the two diode capacitances. Also all other odd orders are cancelled out.

This can be understood by considering the capacitance voltage-characteristics using a Taylor series centered around $V_{bias}$:

$$C = C_0 + C_1*(V - V_{bias}) + C_2*(V - V_{bias})^2 + C_3*(V - V_{bias})^3 + \ldots$$

The absolute voltage across one of the diodes D1, D2 is $(V_{bias} + V_{RF})$ and across the other diode it is $(V_{bias} - V_{RF})$. Thus, the capacitance of the one diode is $$C = C_0 + C_1*(V_{bias} + V_{RF} - V_{bias}) + C_2*(V_{bias} + V_{RF} - V_{bias})^2 + C_3*(V_{bias} + V_{RF} - V_{bias})^3 + \ldots$$

More simply:

$$C = C_0 + C_1*(V_{RF}) + C_2*(V_{RF})^2 + C_3*(V_{RF})^3 + \ldots$$

Accordingly, the capacitance of the other diode is:

$$C = C_0 + C_1*(V_{bias} - V_{RF} - V_{bias}) + C_2*(V_{bias} - V_{RF} - V_{bias})^2 + C_3*(V_{bias} - V_{RF} - V_{bias})^3 \ldots$$

More simply:

$$C = C_0 + C_1*(-V_{RF}) + C_2*(-V_{RF})^2 + C_3*(-V_{RF})^3 + \ldots$$

The total capacitance (the sum of the two capacitances) is:

$$C_{ges} = (C_0 + C_1*(V_{RF}) + C_2*(V_{RF})^2 + C_3*(V_{RF})^3 + \ldots) + (C_0 + C_1*(-V_{RF}) + C_2*(-V_{RF})^2 C_3*(-V_{RF})^3 + \ldots)$$

All odd orders cancel each other so that what remains is:

$$C_{ges} = 2*(C_0 + C_2*(V_{RF})^2 + C_4*(V_{RF})^4 + \ldots)$$

By using diodes with special C-V-curves the remaining non-linear terms can also be cancelled out. The voltage dependence of the diode should have no even orders in the Taylor development around Vbias. The simplest solution is a linear dependency, which would clearly provide the required characteristics.

The voltage dependency of the capacitance above $(V_{bias} + V_{RF})$ and below $(V_{bias} - V_{RF})$ is not important for the frequency response of an ESD protection scheme, since the diodes will only be used within this voltage range.

Thus, one approach is to design diodes with a linear dependency of the capacitance versus the voltage for the voltage range from $V_{low} = (V_{bias} - V_{RF})$ to $V_{high} = (V_{bias} + V_{RF})$ Preferably the capacitance at a bias of $V_{low}$ should be as small as possible and the breakdown voltage of the diode should be high enough (at least higher than $V_{high}$). Fortunately it is possible using known techniques to produce such diodes, e.g. by first determining the necessary doping profile using device simulation software and then by finding a suitable diffusion process using process simulation software.

Examples of the possible doping will now be discussed. For simplicity it is assumed (again) that a p-n junction has infinitely high p-doping (so no extension of the space charge region into the p-region of the diode) and the built-in voltage is disregarded.

At a bias of $V_{low} = (V_{bias} - V_{RF})$ the depletion zone ends at the depth of $x_{low}$ and at the maximal bias $V_{high}$ the depletion zone ends at $x_{high}$.

The doping level between x=0 (the junction) and $x_{low}$ should be as low as possible in order to keep the total capacitance as small as possible (the lower the doping the wider the depletion zone for a given voltage). This also helps with increasing the breakdown voltage of the diode. Between $x_{low}$ and $x_{high}$ the doping level should follow a power law, the doping level being proportional to the inverse of the cubic of the depth: $N(x) \sim x^{-3}$.

This relationship is for example derived in the article "Enabling Low-Distortion Varactors for Adaptive Transmitters" by Cong Huang et. Al., IEEE Transactions on Microwave Theory and Techniques, Vol. 56, No. 5., May 2008, by setting the capacitance to be linearly dependent on the voltage as desired.

Figure 7:
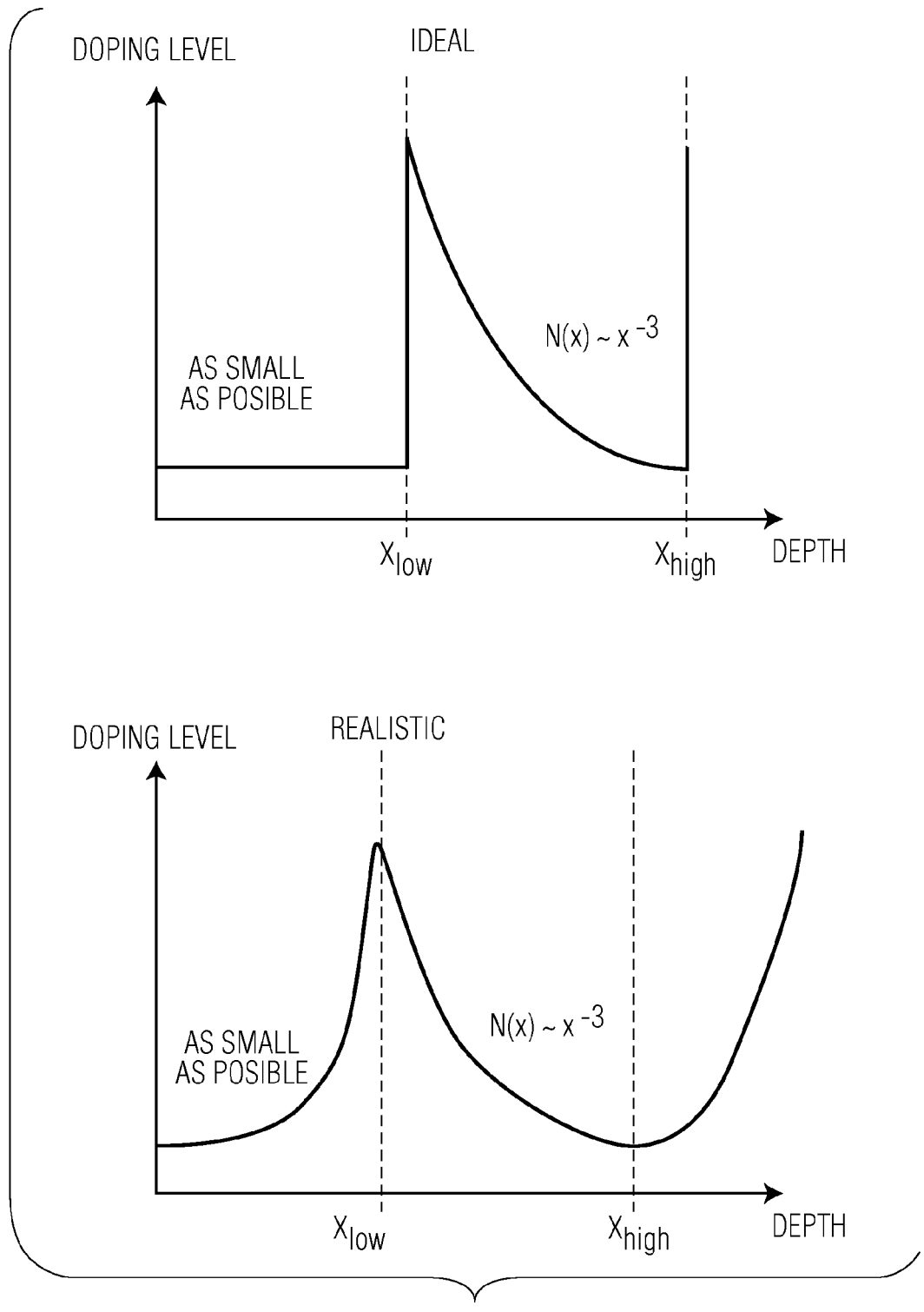
FIG. 7 shows an ideal and a practical diode doping characteristic to achieve a linear dependency of capacitance on voltage.

FIG. 7 shows an ideal doping profile at the top and a practical doping profile at the bottom. As explained above, this is based on providing a linear dependency of capacitance on voltage. The p-n junction is at depth d=0 with p to the left and n to the right.

As explained above, the diodes D1 and D2 are used in the voltage range of Vbias plus/minus the signal level. Thus, their voltage dependency of capacitance near 0 Volt is not important for this application.

This gives options for alternative doping profiles. Instead of seeking a linear capacitance dependency as explained above, an alternative ideal diode would have no capacitance change in the voltage range from (Vbias−signal level) to (Vbias+signal level). This is clearly not possible for semiconductor diodes, but it can be approached with optimized doping profiles.

Figure 8:
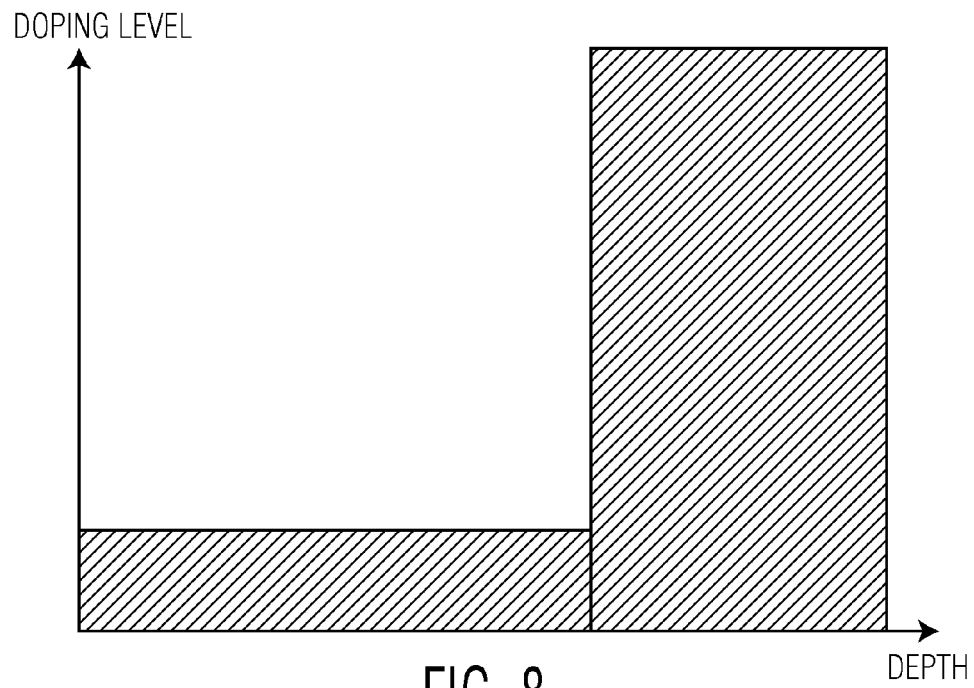
FIG. 8 shows an ideal doping characteristic to achieve a constant capacitance with respect to voltage over a limited voltage range.

FIG. 8 shows a doping profile for a diode with optimized doping profile, which has some similarity to a PIN diode. Not shown is the preferably very high p-doping on the left side of the diode.

The n-doping level near the pn-junction and up to a certain depth is small. Beyond this depth, the doping level is very high. The doping level of the low doped part and the thickness of this low doped region are chosen such that when a voltage of (Vbias−signal level) is applied across the junction then the whole region is depleted. Furthermore, the thickness is sufficient to give a high enough breakdown voltage of the diode (higher than the maximum applied voltage of (Vbias+signal_level).

For voltages above (Vbias−signal_level) the depletion zone will only expand slowly when the voltage is increased, consequently the voltage dependence of the capacitance will be small (and would be zero if the doping level could be made infinite).

Figure 9:
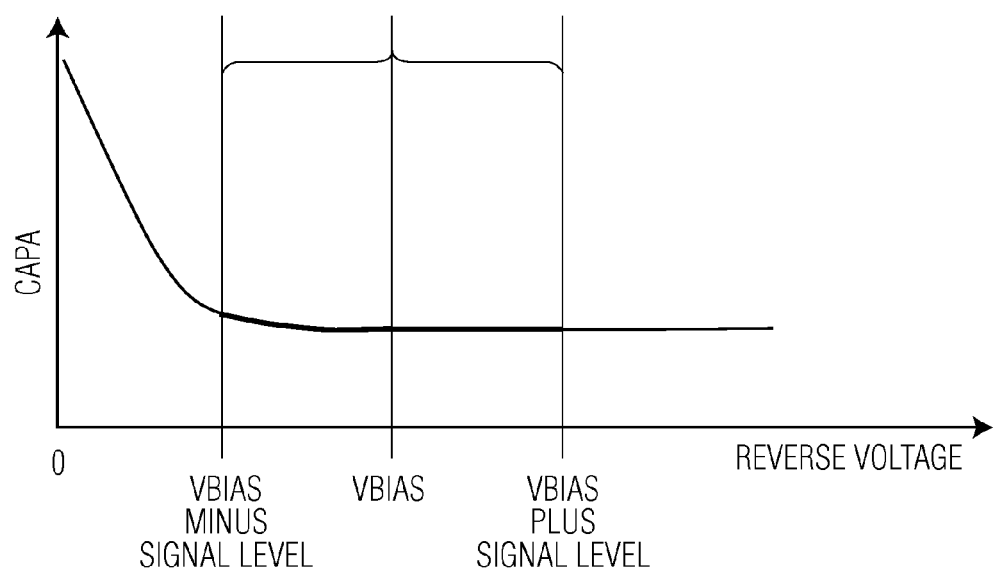
FIG. 9 shows the capacitance voltage characteristic for the doping profile of FIG. 8.

The capacitance versus voltage characteristic is shown schematically in FIG. 9.

An alternative structure is a P++/P+/N++ structure. One lower-doped zone is needed to have enough breakdown voltage (a wide depletion zone) and low capacitance.

Figure 10:
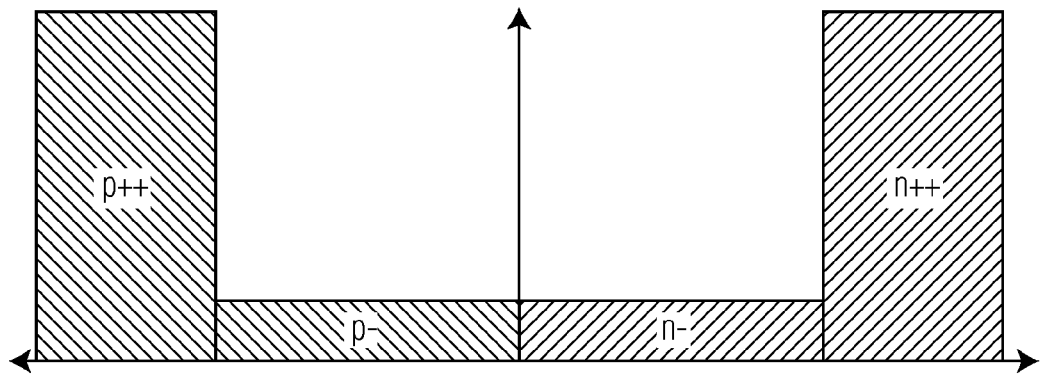
FIG. 10 shows an alternative doping characteristic.

An alternative is a doping structure with adjacent low doped p- and n-regions sandwiched between two high doped regions as shown in FIG. 10.

Figure 11:
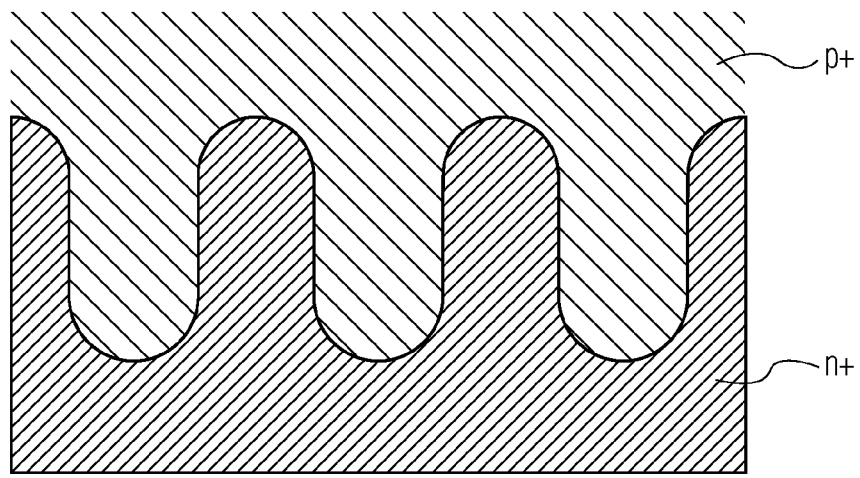
FIG. 11 shows an alternative diode design based on a super-junction diode.

A similar capacitance-voltage characteristic can be achieved with a "super-junction diode". This known type of device achieves charge balance during the off state between the p and n regions. Alternating p and n columns (fingers) are used in the drift region between the p+ anode and the n− cathode. The drift doping can be decreased by decreasing the pillar width. The structure is shown in FIG. 11.

If the bias voltage is high enough, then the fingers are completely depleted. This results in a low capacitance and still a high breakdown voltage. The doping has to be tuned in a similar way as described above, depending on the width of the fingers. For thin enough fingers, the dopant concentration can be higher than in the planar version. This diode implementation allows a faster switch-on with less voltage overshoot and a low capacitance in reverse bias.

Another possible diode design is based on two abrupt junctions with a lowly doped zone (similar to a PIN diode): n+/n−/p+.

The breakdown voltage depends on the thickness of the lowly doped layer, for example around 37 V at 1 µm and around 66V at 2 µm. Therefore 1-2 µm thickness should be sufficient for GSM antenna applications.

At a dopant level of 5e14 the depletion of this layer would already be 4 µm at 5V. However, the layer will not be depleted much more than its thickness because of the high dopant concentration in the neighbouring layers. For operation the diode should be biased to almost full depletion, for example 21V bias would ensure that 16V RF peak voltage would lead to a reverse voltage between 5V and 37V.

Thus, the bias voltage pushes the boundary of the depletion layer to the boundaries of the highly doped layers where it cannot move further. The capacitance and the capacitance change with voltage is low in the biased state.

The circuit of FIG. 2 can be formed as a single three pin package—the three pins being the RF signal line, ground and the supply voltage (for the bias voltage generator).

Figure 12:
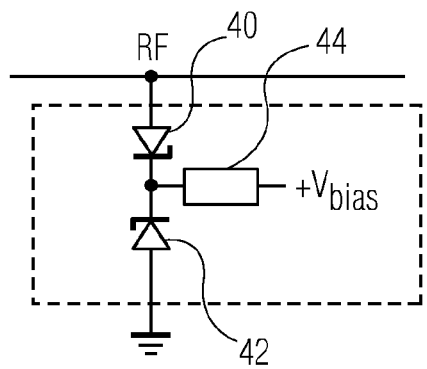
FIG. 12 shows a second example of ESD protection circuit of the invention.

The circuit of FIG. 2 represents a preferred implementation of the invention. However, a simpler circuit can be employed as shown in FIG. 12. This corresponds to the anti-serial diode circuit, which as outlined above is known for the purposes of capacitance tuning, by varying the bias voltage. However, for use as an ESD protection circuit, the bias voltage is constant.

The circuit of FIG. 12 comprises (at least) two diodes 40,42 in series with the opposite polarity between the RF line and ground. The junction between the diodes is connected to a voltage bias by means of a bias resistor 44.

This circuit uses semiconductor components with well defined breakdown, e.g. avalanche or Zener diodes, connected in anti-series. The breakdown voltage of the diodes has to higher than the sum of the bias voltage and of half of the RF peak voltage. One of the diodes 40,42 conducts in reverse and the other conducts in forward if an ESD event occurs.

The diodes can be optimized both for low capacitance and for low distortion. For low capacitance the doping level between the junction and x0 has to as small as possible. Here x0 is the width of the depletion at the voltage U0 and x1 is the width of the depletion zone at U1, whereby U0 is Vbias−Vrfpeak/2 and U1 is Vbias+Vrfpeak/2.

For low distortion the capacitance between U0 and U1 should have a defined characteristic that reduces the distortion effects; in this case C should be proportional to the inverse of the square of U. This translates into the definition for the Doping versus the depth x: for x0<x<x1 the doping level should be constant and higher than for x<x0.

A disadvantage of this arrangement is that the diodes have to withstand stress pulses both in forward and in reverse direction. Therefore the diodes—and accordingly the capacitance of the diodes—have to be chosen large enough to survive the reverse stress; for forward stresses alone they could be chosen much smaller.

Figure 13:
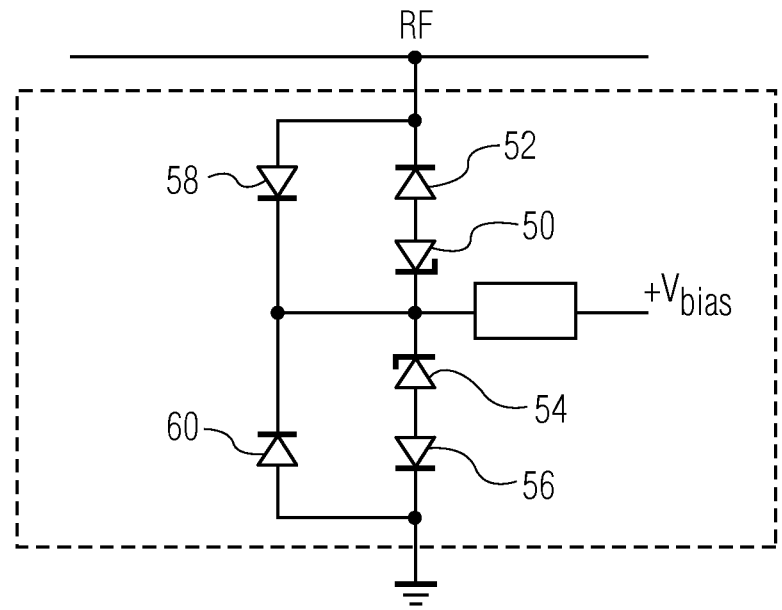
FIG. 13 shows a third example of ESD protection circuit of the invention.

The circuit of FIG. 13 comprises six diodes.

There is a first series connection of two protection components between the signal line and an internal node, comprising a first protection component 50 (for protection) and a second protection component 52 (for clamping) in anti-series;

A second series connection of two protection components is between the internal node and the return line, comprising a third protection component 54 (for protection) and a fourth protection component 56 (for clamping) in anti-series.

A fifth protection component 58 is in a forward direction between the signal line and the internal node. A sixth protection component 60 is in a forward direction between the return line and the internal node. A positive bias voltage source connects to the internal node through a bias impedance.

This arrangement includes two different current paths for positive and negative stress, and it means small diodes can be used for the clamping (steering) devices. The protection devices are all diodes in the example shown.

Again, optimization of capacitance can be based on low doping N(X) for 0<x<x0. Reduced distortion can be obtained with $C \sim U^{-2}$ and doping N(X) for x0<x<x1~constant. This circuit gives low capacitance because of the small forward diodes but it has self-biasing of two floating nodes, which has the effect of rectifying part of the signal until the floating nodes are sufficiently biased.

Figure 14:
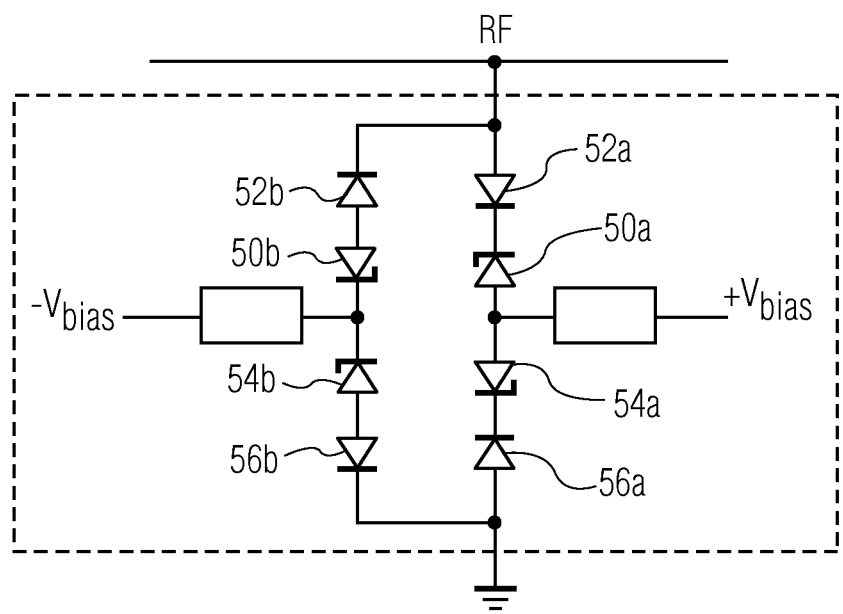
FIG. 14 shows a fourth example of ESD protection circuit of the invention.

The circuit of FIG. 14 comprises eight diodes.

These are arranged as a first series connection of two protection components between the signal line and a first internal node, comprising a first protection component 50a (for protection) and a second protection component 52a (for clamping) in anti-series;

A second series connection of two protection components between the first internal node and the return line comprises a third protection component 54a (for protection) and a fourth protection component 56a (for clamping) in anti-series.

A third series connection of two protection components is between the signal line and a second internal node comprises a fifth protection component 50b (for protection) and a sixth protection component 52b (for clamping) in anti-series.

A fourth series connection of two protection components between the second internal node and the return line comprises a seventh protection component 54b (for protection) and an eighth protection component 56b (for clamping) in anti-series.

A first, positive bias voltage source +Vbias connects to the first internal node through a bias impedance and a second, negative bias voltage source −Vbias connects to the second internal node through a bias impedance.

This circuit again has different current paths for positive and negative stress so again enables small clamping diodes. Again optimization of capacitance can be with low doping N(X) for 0<x<x0. There is again self-biasing of the four floating nodes. Alternatively, the nodes could be connected to the bias voltages by relatively small resistors parallel to the clamping diodes.

The bias voltage(s) used in the circuits above can be generated within the same package as the diode configuration.

Figure 15:
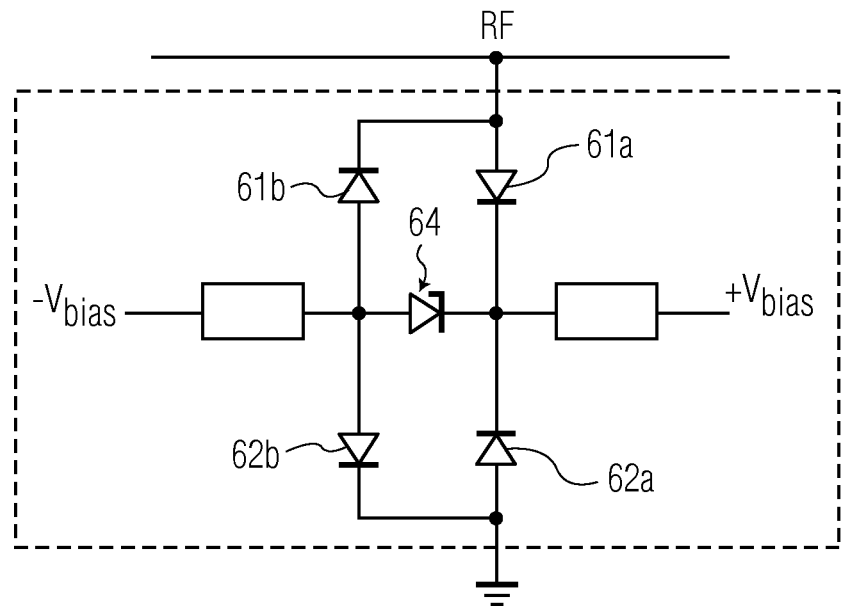
FIG. 15 shows a fifth example of ESD protection circuit of the invention.

FIG. 15 shows another version of the circuit using five diodes.

There is a first series connection of two protection components 61a,62a in anti-series between the signal line and the return line, a positive bias applied to the junction between them. The anodes of the two components connect to the bias.

A second series connection of two protection components 61b,62b is in anti-series between the signal line and the return line, with a negative bias applied to the junction between them. The cathodes of the two components connect to the bias.

A large clamping diode 64 connects in the reverse direction between the two bias points.

This circuit acts like a biased rectifier. If the RF voltage becomes too large, the two of the small diodes (61b and 62a or 62b and 61a) will conduct. The voltage on the large clamping diode 64 will increase until it switches on. Most power is dissipated in the clamping diode 64. The distortion mechanism is now very similar to that of the forth embodiment of FIG. 2.

Figure 16:
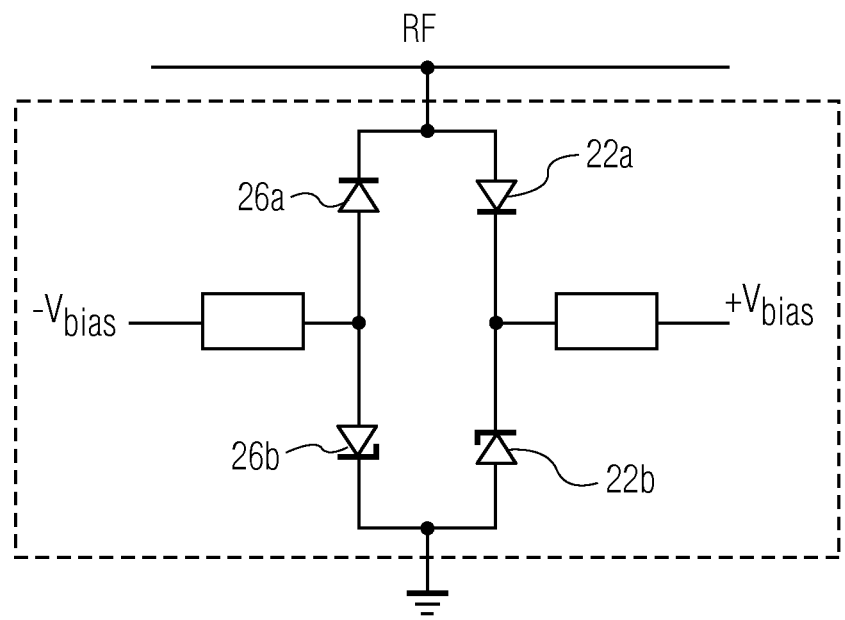
FIG. 16 shows a sixth example of ESD protection circuit of the invention.

FIG. 16 shows that the version of FIG. 2 does not need the bias diodes.

FIGS. 15 and 16 (and FIG. 2) have the advantage that there are no floating nodes, so no unwanted self-biasing.

The circuits above can all be implemented with suitable diode designs to provide no intermodulation. The diode designs will differ for different circuits.

For FIGS. 12, 13, 15 the diode capacitance as a function of voltage U should be proportional to $U^{-2}$ and the doping N(x) should be constant. Alternatively, the capacitance can be proportional to $e^{-U}$ and N(x) should be proportional to $x^{-2}$.

For FIGS. 2 and 16 the diode capacitance as a function of voltage U should be proportional to −U and the doping N(x) should be proportional to $x^{-3}$.

Figure 17:
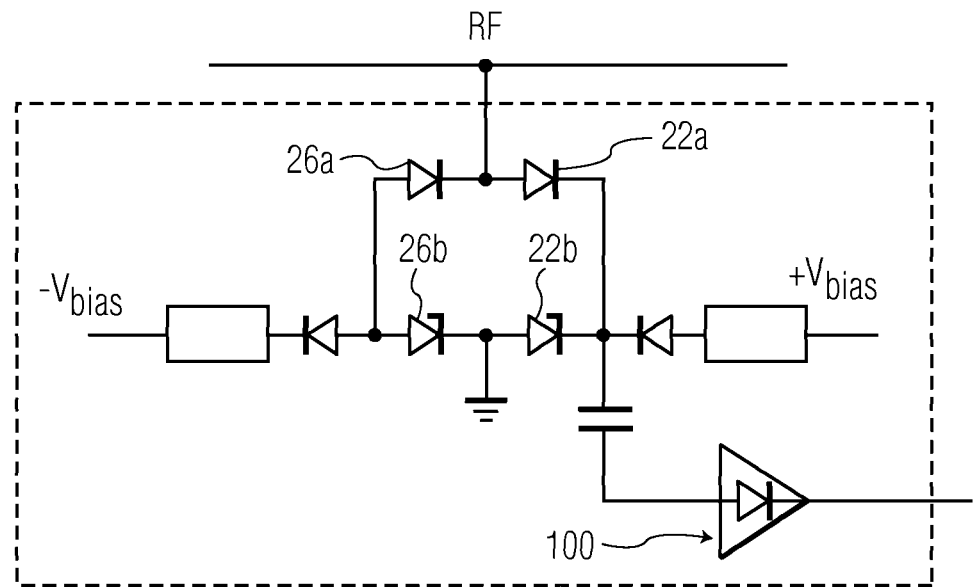
FIG. 17 shows a modification in which an RF signal sensor is integrated into the ESD protection circuit.

In principle a C(V) curve is chosen such that the intermodulation is cancelled. The corresponding doping profile is then calculated. This gives a first indication (the ideal case). Realistic profiles can then be simulated and optimized FIG. 17 shows a modification in which an RF signal sensor is integrated into the ESD protection circuit. The example of FIG. 17 is based on the circuit of FIG. 2. The protection diodes 22a,26a form a capacitive voltage divider with the clamp diodes 22b,26b, and the power detector can thus measure the power at the junction between these diodes as shown. The power detection can also be connected to the RF line, at the cost of slightly higher capacitive loading.

Figure 18:
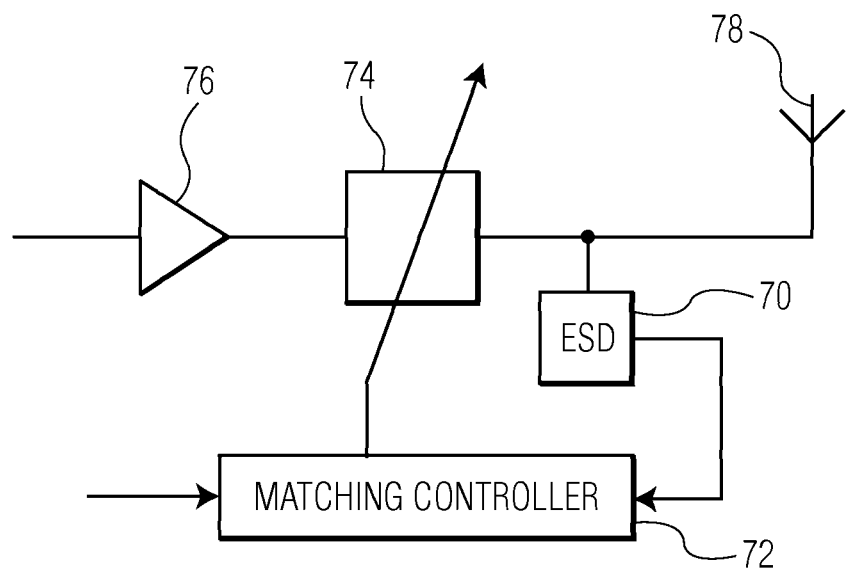
FIG. 18 shows in simplified form how the RF sensor can be used as part of a feedback control system for a matching network control loop.

FIG. 18 shows in simplified form how the RF sensor 100 can be used as part of a feedback control system for a matching network control loop.

As shown, the ESD protection circuit 70 provides an RF signal measure to a matching controller 72, which is then used to control an impedance matching network 74 to provide impedance matching between the power amplifier 76 which drives the antenna and the antenna itself 78.

The signal measure can be a digital output for easy interfacing with the matching circuit controller 72. The power measure may also be provided onto a communications link to be used for other purposes, such as testing, configurability, transfer of status signals or sensor signals. The sensor signal can also be used for automatic detection of stand-by (so that the device detects turn on when an RF pulse starts).

A phase detector could also be implemented within the ESD circuit or the ESD protection component could connect to a coil to sense the current. In this case the ESD protection is best fully integrated into the tuning circuit or the antenna to re-use the coils that already exist in these circuits.

The ESD protection would then become more integral to the matching network. An integrated charge pump can be used to supply the voltage for the matching network.

The circuit components shown above can be formed in a single package, or even integrated onto a single chip. By integrating the bias voltage source into the package, the number of package terminals is kept to a minimum.

Other semiconductor types, for example super-barrier diodes or transistors can also be used to implement the diode functions. Thus, the examples above show the use of diodes in the circuits, but these diodes may be implemented as transistors, for example with base to the emitter connections. Also an open-base transistor, punch-through diodes, or other circuits might be used. Essentially a switching component is used, and the invention provides biasing and the filtering of the bias noise. The anti-series or anti-parallel connections described above help to reduce distortions.

The circuits of the invention enable lower overshoot voltage than in currently available passive devices, and they give higher linearity than available semiconductor devices.

It will be clear from the above that when the invention is implemented with diodes, the doping profile on each side of the p-n junction can be designed to achieve a constant capacitance with respect to voltage or a liner capacitance with respect to voltage. The linear capacitance function can be achieved by providing a doping concentration which varies with distance on one side from the p-n junction with an approximate inverse cube function, and which is constant on the other side of the p-n junction. The constant capacitance function can be achieved by providing a doping concentration which varies with distance from the p-n junction with an approximate step function at a certain depth from the junction on one side (and a constant doping concentration on the other side)

Generally, the doping profile can be designed to achieve a minimum dependency.

Various modifications will be apparent to those skilled in the art.

The invention claimed is:

1. An ESD protection circuit comprising a series connection of at least two semiconductor components between a signal line to be protected and a return line, comprising a first protection component connected to the signal line and a second protection component connected to the return line in series with the first protection component, and a bias voltage source which connects to the junction between the two protection components through a bias impedance;
wherein the first protection component is connected in a forward conduction direction between the signal line and the return line, and the second protection component is connected in a reverse conduction direction between the signal line and the return line;
a first series connection of at least two protection components between the signal line and the return line, comprising the first protection component and the second protection component, and the bias voltage source which connects to the junction between the first and second protection components through the bias impedance; and a second series connection of at least two protection components between the signal line and the return line, comprising a third protection component and a fourth protection component in series with opposite polarity, and a second bias voltage source which connects to the junction between the third and fourth protection components through a second bias impedance;

wherein the third protection component is connected in a reverse conduction direction between the signal line and the return line, and the fourth protection component is connected in a forward conduction direction between the signal line and the return line;

wherein the first bias voltage source connects to the junction between the first and second protection components through a first noise blocking diode in series, and the second bias voltage source connects to the junction between the third and fourth protection components through a second noise blocking diode in series; and wherein the first bias voltage source is positive and the second bias voltage source is negative, and the first voltage source is on the anode side of the first noise blocking diode and the second voltage source is on the cathode side of the second noise blocking diode.

2. A circuit as claimed in claim 1, wherein the capacitance of the first protection component is less than the capacitance of the second protection component.

3. A circuit as claimed in claim 1, wherein the first protection component and the second protection component are back to back diodes connected at their cathodes, and the third protection component and the fourth protection component are back to back diodes connected at their anodes.

4. A circuit as claimed in claim 1, wherein the second protection component and the fourth protection component comprise diodes with a breakdown voltage greater than 20V where at least one of these diodes conducts in reverse direction during a protection event.

5. A circuit as claimed in claim 1, wherein the first protection component and the second protection component are each diodes, with the anode of the first protection component connected to the signal line and the anode of the second protection component connected to the return line where at least one of these diodes conducts in reverse direction during a protection event.

6. A circuit as claimed in claim 1, wherein the circuit is formed as a single package.

7. A circuit as claimed in claim 1, further comprising a power sensor for measuring a power level on the signal line.

8. An RF antenna circuit comprising an antenna and a circuit as claimed in claim 1, wherein the signal line comprises the antenna feed.

9. An RF antenna circuit as claimed in claim 8, comprising a GSM antenna circuit.

10. An RF antenna circuit as claimed in claim 8, wherein the ESD protection circuit comprises a power sensor for measuring a power level on the signal line, wherein the antenna circuit comprises an impedance matching circuit which receives as input the power sensor signal.

11. An ESD protection circuit comprising a series connection of at least two semiconductor components between a signal line to be protected and a return line, comprising a first protection component connected to the signal line and a second protection component connected to the return line in series with the first protection component, and a bias voltage source which connects to the junction between the two protection components through a bias impedance;

wherein the first protection component is connected in a forward conduction direction between the signal line and the return line, and the second protection component is connected in a reverse conduction direction between the signal line and the return line;

a first series connection of at least two protection components between the signal line and the return line, comprising the first protection component and the second protection component, and the bias voltage source which connects to the junction between the first and second protection components through the bias impedance; and a second series connection of at least two protection components between the signal line and the return line, comprising a third protection component and a fourth protection component in series with opposite polarity, and a second bias voltage source which connects to the junction between the third and fourth protection components through a second bias impedance;

wherein the third protection component is connected in a reverse conduction direction between the signal line and the return line, and the fourth protection component is connected in a forward conduction direction between the signal line and the return line;

wherein the first protection component and the second protection component are back to back diodes connected at their cathodes, and the third protection component and the fourth protection component are back to back diodes connected at their anodes.

* * * * *